United States Patent
Liu et al.

(10) Patent No.: US 12,183,795 B2
(45) Date of Patent: Dec. 31, 2024

(54) NOTCH SHAPE OF TRENCH GATE BOTTOM CORNER FOR BETTER BREAKDOWN VOLTAGE OF POWER MOSFET AND IGBT WITH GOOD TRADE OFF TO RON AND OX RELIABILITY

(71) Applicant: SiEn (QingDao) Integrated Circuits Co., Ltd., Shandong (CN)

(72) Inventors: Conghui Liu, Qingdao (CN); Peng Li, Qingdao (CN); Min-Hwa Chi, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 406 days.

(21) Appl. No.: 17/707,548

(22) Filed: Mar. 29, 2022

(65) Prior Publication Data

US 2022/0320303 A1    Oct. 6, 2022

(30) Foreign Application Priority Data

Apr. 2, 2021  (CN) .................. 202110361602.X

(51) Int. Cl.
| | |
|---|---|
| *H01L 29/423* | (2006.01) |
| *H01L 29/16* | (2006.01) |
| *H01L 29/20* | (2006.01) |
| *H01L 29/40* | (2006.01) |
| *H01L 29/66* | (2006.01) |
| *H01L 29/739* | (2006.01) |
| *H01L 29/78* | (2006.01) |

(52) U.S. Cl.
CPC ........ *H01L 29/4236* (2013.01); *H01L 29/401* (2013.01); *H01L 29/7397* (2013.01); *H01L 29/7813* (2013.01); *H01L 29/1608* (2013.01); *H01L 29/2003* (2013.01); *H01L 29/66068* (2013.01); *H01L 29/66348* (2013.01); *H01L 29/66522* (2013.01); *H01L 29/66734* (2013.01)

(58) Field of Classification Search
CPC .............. H01L 29/4236; H01L 29/401; H01L 29/7397; H01L 29/7813; H01L 29/1608; H01L 29/2003; H01L 29/66068; H01L 29/66348; H01L 29/66522; H01L 29/66734; H01L 29/42376; H01L 21/048; H01L 21/049; H01L 29/7398; H01L 29/0696; H01L 29/1095; H01L 29/66325; H01L 29/7393; H01L 29/7395
See application file for complete search history.

(56) References Cited

U.S. PATENT DOCUMENTS

2022/0148923 A1* 5/2022 Tsui .................. H01L 29/66068

OTHER PUBLICATIONS

Seng, "Review on Methods for Trench MOSFET Gate Oxide Reliability and Switching Speed Improvement", ECS Transactions, 2010, vol. 27, No. 1, p. 21-26, The Electrochemical Society.

(Continued)

*Primary Examiner* — Mohammad A Rahman
(74) *Attorney, Agent, or Firm* — Chen Yoshimura LLP

(57) ABSTRACT

The present invention provides a device having a trench gate structure and a method of making the same. The device comprises a substrate, a drift region, a well region, a trench gate, a heavily-doped region, and an electrode positioned on the heavily-doped region. The structure of the device is simple to provide good VDMOS and IGBT breakdown voltages, and meanwhile take on-state resistance and reliability of oxide into account.

10 Claims, 3 Drawing Sheets

(56) References Cited

OTHER PUBLICATIONS

Baliga, "Trends in Power Semiconductor Devices", IEEE Transactions on Electron Devices, Oct. 1996, vol. 43, No. 10, p. 1717-1731.

* cited by examiner

NOTCH SHAPE OF TRENCH GATE BOTTOM CORNER FOR BETTER BREAKDOWN VOLTAGE OF POWER MOSFET AND IGBT WITH GOOD TRADE OFF TO RON AND OX RELIABILITY

FIELD OF THE INVENTION

The present invention relates to a semiconductor device and a method of making the same, and especially relates to a device having a trench gate structure and a method of making the same.

BACKGROUND OF THE INVENTION

A trench gate structure is commonly seen in MOSFET and IGBT devices. FIG. 1 shows a VDMOS device having a trench gate structure. The device comprises a drift region 200 on a n+ substrate 100. The drift region 200 is a n− epitaxial layer. On the drift region 200, a p-well 300 is positioned, and in the p-well 300, a heavily doped n+ region 500 is positioned. A power MOSFET device may further comprise a gate material 401 on the drift region 200 and a gate dielectric layer 402 positioned between the gate 401 and the p-well 300. A source electrode 600 is positioned on the p-well 300, and a back gold electrode 700 is positioned at the other side of the substrate as a drain.

Development trend of the device having a trench gate structure starts from a right-angle structure, and then a rounded bottom structure and a bottom thick-oxide structure. In a traditional process of trench formation, oxide on a (110) crystal face of a trench sidewall is thicker than that on a trench bottom, which is a (100) crystal face. When a width of the trench bottom is small, because of stress and limitation of oxide diffusion into a corner interface between an insulator and sidewall substrate, growth of thermal oxide is limited, so as to weaken a corner of the trench bottom. When a width of the trench bottom is great, because of slow oxidation rate in the (100) crystal face of the trench bottom, a oxide layer thinner than the sidewall is formed, but a thickness of oxide at the bottom corner is the same at that on the sidewall.

Studies prove that ion etching may promote oxidation rate of the trench bottom, i.e. implementation of Ar, As, P, O ions at a certain angle into the trench bottom may increase the oxidation rate of Si of the trench bottom. Two sacrificial oxide layers may smooth a right angle of the trench bottom to even the oxidation rate, because the sacrificial oxide layers will inhibit thinning the bottom oxide, but when a width of the gate is <0.5 um, such inhibition is not enough. Therefore, these two skills may be combined together, i.e. forming two sacrificial oxide layers in the trench etching process to round the trench bottom, so as to form rounded thick oxide layer at the gate bottom.

For ordinary power MOSFET and IGBT devices, the relation between an on-state resistance Ron (saturation voltage Vsat) and a breakdown voltage (BV) of the gate structure is positive correlation. A split-gate trench may balance Ron (Vsat) and BV in a better way. A super junction technology may increase BV and decrease Ron even further at the same time through a more complex way to turn a p drift region into a n drift region to compensate charges. Such structures are complex and made through a long process. Thus, for power MOSFET and IGBT devices having a trench gate structure, how to design a simpler structure which can be made with a simple process to effectively balance parameters such as the thickness of the bottom oxide, Ron (Vsat) and BV is technical challenge in the industry.

SUMMARY OF THE INVENTION

In light of aforesaid problems in the current technologies, an object of the present invention is to provide a device having a trench gate structure and a method of making the same to take all issues of breakdown voltage, on-state resistance and reliability of oxide, that hardly be achieved in the current technologies, into account.

An aspect of the present invention provides a device having a trench gate structure, comprising: a substrate, having a first conductivity type, and the substrate having a first main surface and a second main surface opposite to the first main surface; a drift region, formed on the first main surface of the substrate, the drift region having a first conductivity type, and a carrier content of the drift region being lower than that of the substrate; a well region, formed on the drift region, and the well region having the second conductivity type opposite to the first conductivity type; a trench gate, the trench gate passing through the well region and reaching the drift region, a bottom corner of two sides of the trench gate having a recess expanding outwardly, and an internal angle of the recess being less than 90°; a heavily-doped region, formed in the well region and at a side edge of the trench gate, and the heavily-doped region having the first conductivity type; and an electrode positioned on the heavily-doped region, and the electrode contacting with the heavily-doped region and at least partially extending in the well region.

Optionally, the substrate may comprise one of silicon, silicon carbide, germanium and gallium nitride.

Optionally, the electrode may be of a metal material.

Optionally, the trench gate may comprise a trench, a gate dielectric layer positioned at a trench sidewall and a gate material filling the trench, the gate material may comprise at least one of polysilicon, metal and metal silicide, and the gate dielectric layer may comprise one of silicon dioxide and silicon nitride layer.

Optionally, the second main surface of the substrate may be further formed with a drain to form a VDMOS device.

Optionally, the second main surface of the substrate may be formed with a collector region of the second conductivity type, and a surface of the collector region may be formed with a collector electrode to form an IGBT device.

Optionally, the internal angle of the recess may be between 20~70°.

Another aspect of the present invention provides a method of making a device having a trench gate structure, comprising steps of: providing a substrate, the substrate having a first conductivity type, and the substrate having a first main surface and a second main surface opposite to the first main surface; forming a drift region on the first main surface of the substrate, the drift region having the first conductivity type, and a carrier content of the drift region being lower than that of the substrate; forming a well region on the drift region, and the well region having the second conductivity type opposite to the first conductivity type; forming a trench gate passing through the well region and reaching the drift region, a bottom corner of two sides of the trench gate having a recess expanding outwardly, and an internal angle of the recess being less than 90°; forming a heavily-doped region in the well region and at a side edge of the trench gate, and the heavily-doped region having the first conductivity type; and positioning an electrode on the heavily-doped region, and the electrode contacting with the heavily-doped region and at least partially extending in the well region.

Optionally, a step of performing anisotropic trench etching along a vertical direction until being close to a desirable depth may be performed at first, and then a step of performing isotropic etching at a trench bottom may be performed, and the isotropic etching may be performed vertically and horizontally at the same time to form the recess.

Optionally, the internal angle of the recess may be adjusted through an isotropic etching rate, an etching time and an etching temperature.

As mentioned above, the device having a trench gate structure and the method of making the same of the present invention may bring benefits: the new trench gate structure having a bottom corner for VDMOS and IGBT devices may strike a balance between Ron (Vsat), BV (breakdown voltage) and oxide thickness to provide a better VDMOS and IGBT breakdown voltage, and meanwhile take on-state resistance and reliability of oxide into account. The trench gate structure for VDMOS and IGBT devices does not need to form a rounded angle for the trench bottom, additional connection to a source (ground) nor a super junction structure formed with a complex epitaxy process, so that a method of making the same is simple and feasible. The process and structure may be adapted to all the trench gate structure power devices with Si, SiC and/or GaN base.

BRIEF DESCRIPTION OF THE DRAWINGS

Various objects and advantages of the present invention will be more readily understood from the following detailed description when read in conjunction with the appended drawing as follows.

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please note that the drawings provided here are only for examples but not limited to the specific number or scale shown therein. When implementing the examples according to the drawings, condition, number and proportion of each element may be changed and arrangement of the elements may be in a more complex way in three-dimensional sizes such as length, width and depth. Cross-sectional views may be enlarged but not in proportion.

Please also note that terms to illustrate spatial relation used here, such as "below," "under," "lower than," "on," "above," etc., are taken to describe a relation between an element or feature and other element(s) or feature(s). It is readily to be understood that such terms comprise other direction(s) of an operating device not shown in the figures. Further, when a layer is described as being between two layers, it may be the only layer or layered having other layer(s) between the two layers. "Between" comprises values at two ends.

Please further note that when describing a first feature is on a second feature, such description comprises an embodiment in which the first feature is in direct contact with the second feature and another embodiment in which the first feature is in indirect contact with the second feature and another feature is formed therebetween.

Please note that the drawings provided here are only for examples but not limited to the specific number or scale shown therein. When implementing the examples according to the drawings, condition, number, shape, size, relative position and proportion of each element may be changed and arrangement of the elements may be in a more complex way.

Figure 1:
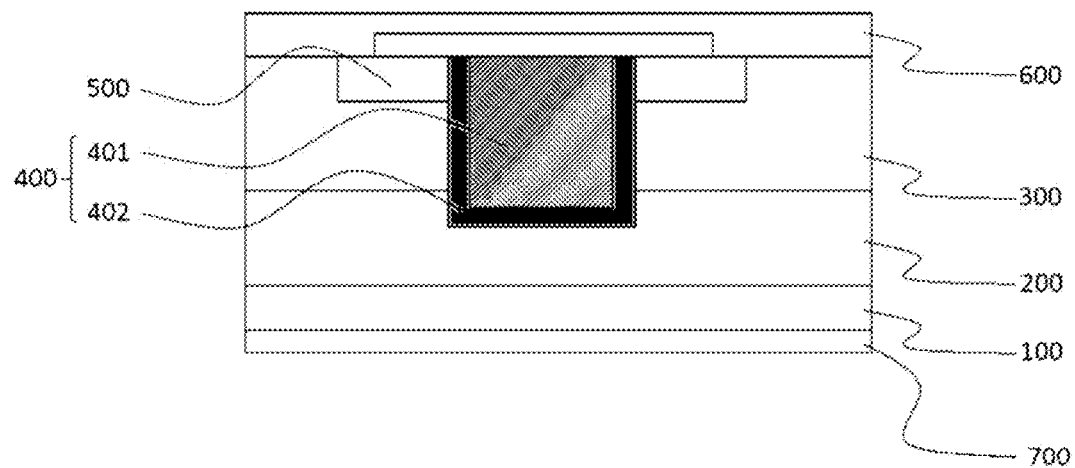
FIG. 1 shows a perspective view of a traditional trench gate structure.
Figure 2:
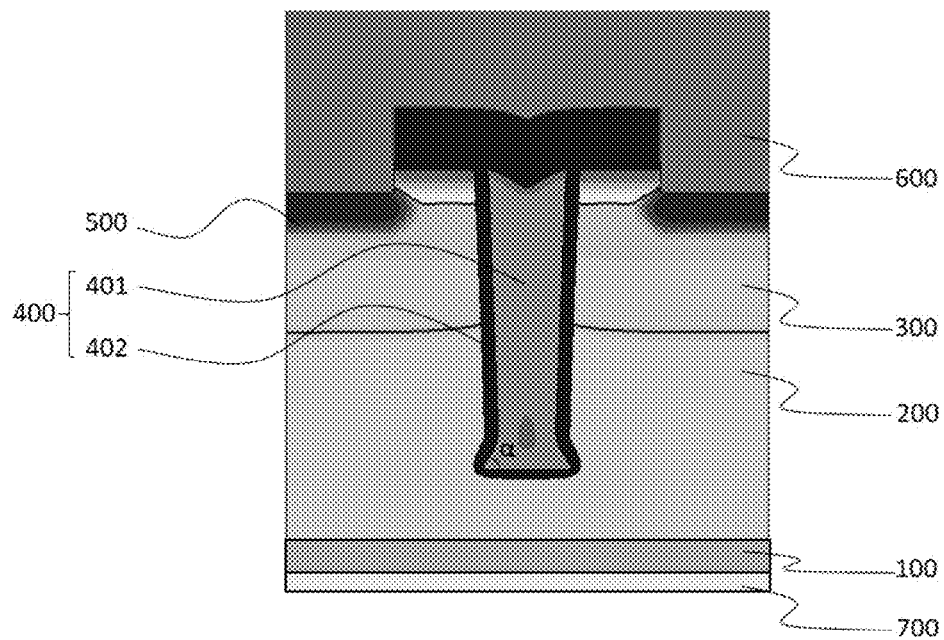
FIG. 2 shows a perspective view of a trench gate structure VDMOS device according to the present invention.

As shown in FIG. 2, the present embodiment provides a VDMOS device having a trench gate structure, at least comprising: a substrate 100, having a first conductivity type, the substrate 100 having a first main surface and a second main surface opposite to the first main surface, in which the substrate 100 may be one of silicon, silicon carbide, germanium and gallium nitride; a drift region 200, formed on the first main surface of the substrate 100, the drift region 200 having the first conductivity type, and a carrier content of the drift region 200 being lower than that of the substrate; a well region 300, formed on the drift region 200, the well region 300 having the second conductivity type opposite to the first conductivity type; a trench gate 400, the trench gate 400 passing through the well region 300 and reaching the drift region 200, a bottom corner of two sides of the trench gate 400 having a recess expanding outwardly, an internal angle of the recess being less than 90°, and preferably between 20~70°, in which the trench gate 400 may comprise a trench, a gate dielectric layer 402 on a trench sidewall and a gate material 401 filling the trench, the gate material 401 may be at least one of polysilicon, metal and metal silicide, and the gate dielectric layer 402 may be an insulating layer such as silicon dioxide and silicon nitride layer; a heavily-doped region 500, formed in the well region 300 and at a side edge of the trench gate 400, the heavily-doped region 500 having the first conductivity type, in which an electrode 600 is positioned on the heavily-doped region 500, the electrode 600 may be of a metal material, the electrode 600 may contact with the heavily-doped region 500 and at least partially extending in the well region 300, and a drain 700 may be formed in the second main surface of the substrate 100.

As shown in FIG. 2, a method of making a VDMOS device having a trench gate structure is disclosed. The method may comprise steps of: providing a substrate 100 having a first conductivity type, and the substrate 100 having a first main surface and a second main surface opposite to the first main surface; forming a drift region 200 on the first main surface of the substrate 100, the drift region 200 having the first conductivity type, and a carrier content of the drift region 200 being lower than that of the substrate 100; forming a well region 300 on the drift region 200, the well region 300 having the second conductivity type opposite to the first conductivity type; forming a trench gate 400 passing through the well region 300 and reaching the drift region 200, a bottom corner of two sides of the trench gate 400 having a recess expanding outwardly, and an internal angle of the recess being less than 90°, in which preferably, a step of performing anisotropic trench etching along a vertical direction until being close to a desirable depth may be performed at first, and then a step of performing isotropic etching at a trench bottom may be performed, the isotropic etching may be performed vertically and horizontally at the same time to form the recess, and the internal angle of the recess may be adjusted through an isotropic etching rate, an etching time and an etching temperature; forming a heavily-doped region 500 in the well region 300 and at a side edge of the trench gate 400, and the heavily-doped region 500 having the first conductivity type; positioning an electrode 600 on the heavily-doped region 500, and the electrode 600 contacting with the heavily-doped region 500 and at least partially extending in the well region 300, in which a drain 700 may be formed in the second main surface of the substrate 100 to form the VDMOS device.

Figure 3:
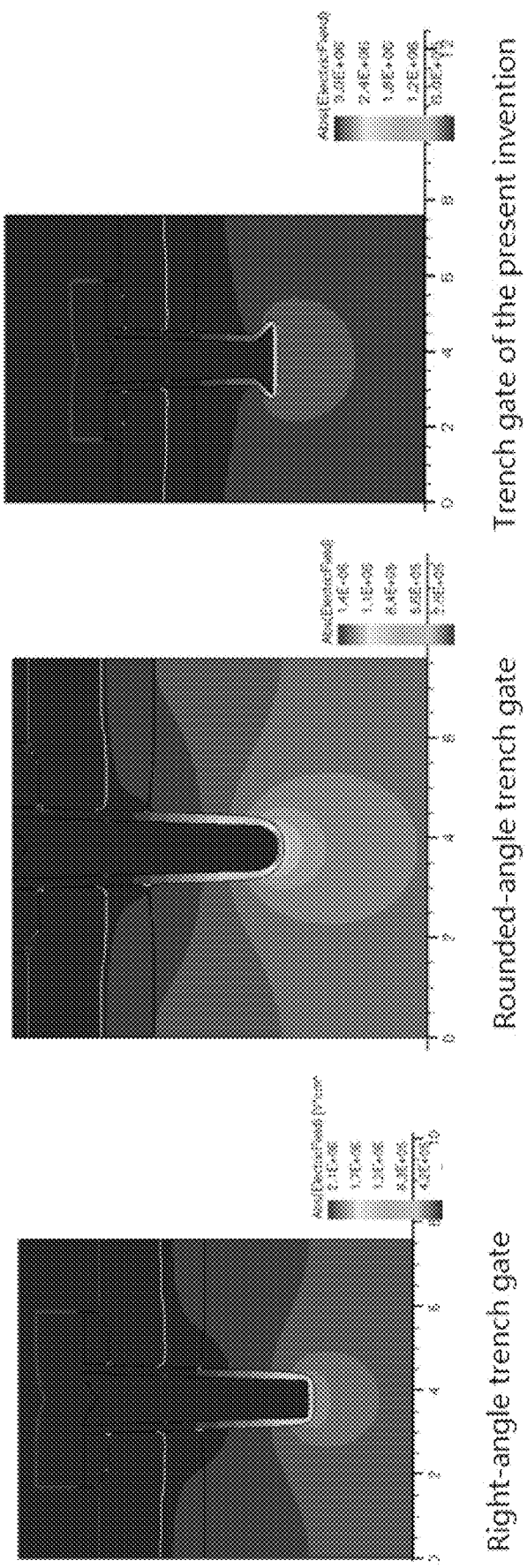
FIG. 3 shows an analogue diagram of a TCAD electrical characteristic of a right-angle trench gate structure, a rounded-angle trench gate structure and a trench gate structure VDMOS device according to the present invention.

FIG. 3 shows an analogue diagram of a TCAD electrical characteristic of a right-angle trench gate structure, a rounded-angle trench gate structure and a trench gate structure VDMOS device according to the present invention. Meanwhile, the table shown below gives a comparison of BV, Vsat and maximum field strength between VDMOS devices having a right-angle trench gate structure, rounded-angle trench gate structure and bottom recess trench gate structure of the present embodiment.

| Experiment | Type | BV/V | Vsat/V | Maximum Field Strength/V*CM−1 |
|---|---|---|---|---|
| 1 | Right angle | 739 | 2.700 | 2.10E+06 |
| 2 | Rounded angle | 729 | 2.650 | 1.40E+06 |
| 3 | α = 84 degrees | 765 | 2.500 | 2.20E+06 |
| 4 | α = 74 degrees | 770 | 2.600 | 1.60E+06 |
| 5 | α = 64 degrees | 772 | 2.640 | 2.40E+06 |
| 6 | α = 52 degrees | 782 | 2.690 | 8.80E+06 |
| 7 | α = 44 degrees | 788 | 2.730 | 8.00E+06 |

From FIG. 3 and the table, it is readily understood that the maximum field strength of the right-angle trench gate structure is at apex of the angle. The gate oxide layer of the rounded-angle trench is thinner. BV of the right-angle trench gate structure is thicker, but increment of Vsat is not much. Therefore, from the experiment data, it is readily understood that compared with the two structures, the trench gate structure of the present invention presents better BV and less Vsat, and along with decreasing of the internal angle (a), i.e. along with the increasing of a width of the gate bottom, BV increases and Vsat slightly increases.

Compared with factors such as plasma induced damage, dopant type, crystal faces, etc., rounded-angle bottom is not a main solution to increase thickness of oxide, and rounded-angle bottom cannot improve BV and Ron effectively. Rather, the TCAD data shows that the recess at the corner of the trench bottom can effectively improve BV. Because the oxide at the inner of the corner is thicker, reliability of oxide can be promoted; electrical field at an apex of the bottom corner of the trench gate may be strengthened to reduce Ron.

Generally speaking, thinning oxide thickness may result in reliability of oxide in on-state, but actually, oxide thickness may be controlled by the internal angle (α), i.e. less internal angle of the bottom may result in a greater oxide thickness than that of a rounded-angle having a greater internal angle (>90°) bottom, and therefore, the recess of the bottom corner may benefit in thickening the oxide thickness.

In on-state, although the angle of the recess may occupy a certain portion of the N-the drift region to decrease Ron slightly, high electrical field at the sharper polysilicon gate will accumulate more induced carrier at the drift region closed to the angle of the recess, and eventually Ron is merely slightly affected. In off-state, at first, electrical field in a depletion region may be re-distributed in a more even way, so as to increase the breakdown voltage; second, silicon oxide in the bottom corner may be thicker than Si, and bear breakdown better; further, because the electrical field only relates to ion dopant in the depletion region, the angle of the recess, where is sharper in the recess, may not generate greater electrical field. As such, the trench gate of the present invention allows increasing of the breakdown voltage in off-state.

To sum up, the present invention may effectively carry out balance and optimization of oxide thickness, Ron and BV in devices through simple process and structure.

Figure 4:
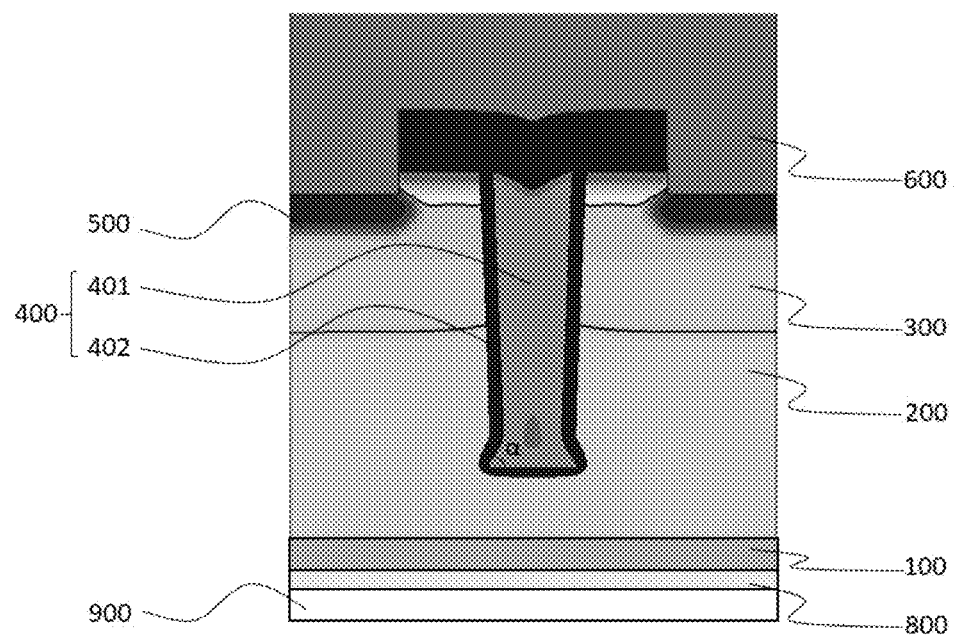
FIG. 4 shows a perspective view of a trench gate structure IGBT device according to the present invention.

As shown in FIG. 4, the present embodiment further provides an IGBT device having a trench gate structure, comprising: a substrate 100, having a first conductivity type, the substrate 100 having a first main surface and a second main surface opposite to the first main surface, in which the substrate 100 may be one of silicon, silicon carbide, germanium and gallium nitride; a drift region 200, formed in the first main surface of the substrate 100, the drift region 200 having the first conductivity type, a carrier content of the drift region 200 being less than that of the substrate; a well region 300, formed on the drift region 200, the well region 300 having the second conductivity type opposite to the first conductivity type; a trench gate 400, the trench gate 400 passing through the well region 300 and reaching the drift region 200, a bottom corner of two sides of the trench gate 400 having a recess expanding outwardly, an internal angle of the recess being less than 90°, and preferably between 20~70°, in which the trench gate 400 may comprise a trench, a gate dielectric layer 402 on a trench sidewall and a gate material 401 filling the trench, the gate material 401 may be at least one of polysilicon, metal and metal silicide, and the gate dielectric layer 402 may be an insulating layer such as silicon dioxide and silicon nitride layer; a heavily-doped region 500, formed in the well region 300 and at a side edge of the trench gate 400, the heavily-doped region 500 having the first conductivity type; and an electrode 600 positioned on the heavily-doped region, in which the electrode 600 may be of a metal material, the electrode 600 may contact with the heavily-doped region 500 and at least partially extending in the well region 300, the second main surface of the substrate 100 may be formed with a collector region 800 of the second conductivity type, and a surface of the collector region 800 may be formed with a collector electrode 900.

As shown in FIG. 4, the present embodiment further provides a method of making an IGBT device having a trench gate structure, comprising steps of: providing a substrate 100 having a first conductivity type, and the substrate 100 having a first main surface and a second main surface opposite to the first main surface; forming a drift region 200 on the first main surface of the substrate 100, the drift region 200 having the first conductivity type, and a carrier content of the drift region 200 being lower than that of the substrate 100; forming a well region 300 on the drift region 200, the well region 300 having the second conductivity type opposite to the first conductivity type; forming a trench gate 400 passing through the well region 300 and reaching the drift region 200, a bottom corner of two sides of the trench gate 400 having a recess expanding outwardly, and an internal angle of the recess being less than 90°, in which preferably, a step of performing anisotropic trench etching along a vertical direction until being close to a desirable depth may be performed at first, and then a step of performing isotropic etching at a trench bottom may be performed, the isotropic etching may be performed vertically and horizontally at the same time to form the recess, and the internal angle of the recess is adjusted through an isotropic etching rate, an etching time and an etching temperature; forming a heavily-doped region 500 in the well region 300 and at a side edge of the trench gate 400, and the heavily-doped region 500 having the first conductivity type; positioning an electrode 600 on the heavily-doped region 500, and the electrode 600 contacting with the heavily-doped region 500 and at least partially extending in the well region 300, in which a collector region 800 may be formed in the second main surface of the substrate 100, the collector region 800 having the second conductivity type opposite to the first conductivity type, and a collector electrode 900 may be formed on a surface of the collector region 800 to form the IGBT device.

As mentioned above, the device having a trench gate structure and the method of making the same of the present invention may be applied in VDMOS and IGBT devices to strike a balance between Ron (Vsat), BV (breakdown voltage) and oxide thickness to provide a better VDMOS and IGBT breakdown voltage, and meanwhile take on-state resistance and reliability of oxide into account. The trench gate structure for VDMOS and IGBT devices does not need to form a rounded angle for the trench bottom, additional connection to a source (ground) nor a super junction structure formed with a complex epitaxy process, so that a method of making the same is simple and feasible. The process and structure may be adapted to all the trench gate structure power devices with Si, SiC and/or GaN base. As such, the present invention overcomes various drawbacks in the current technologies and brings valuable usage in the industry.

It is to be understood that these embodiments are not meant as limitations of the invention but merely exemplary descriptions of the invention. Indeed, different adaptations may be apparent to those skilled in the art without departing from the scope of the annexed claims.

What is claimed is:

1. A device having a trench gate structure, comprising:
a substrate having a first conductivity type, and the substrate having a first main surface and a second main surface opposite to the first main surface;
a drift region formed on the first main surface of the substrate, the drift region having the first conductivity type, and a carrier content of the drift region being lower than that of the substrate;
a well region formed on the drift region, and the well region having a second conductivity type opposite to the first conductivity type;
a trench gate, the trench gate passing through the well region and reaching the drift region, a bottom corner of two sides of the trench gate having a recess expanding outwardly, and an internal angle of the recess being less than 90°;
a heavily-doped region formed in the well region and at a side edge of the trench gate, and the heavily-doped region having the first conductivity type; and
an electrode positioned on the heavily-doped region, and the electrode contacting with the heavily-doped region and at least partially extending in the well region.

2. The device having a trench gate structure according to claim 1, wherein the substrate comprises one of silicon, silicon carbide, germanium and gallium nitride.

3. The device having a trench gate structure according to claim 1, wherein the electrode is of a metal material.

4. The device having a trench gate structure according to claim 1, wherein the trench gate comprises a trench, a gate dielectric layer positioned at a trench sidewall and a gate material filling the trench, the gate material comprises at least one of polysilicon, metal and metal silicide, and the gate dielectric layer comprises one of silicon dioxide and silicon nitride layer.

5. The device having a trench gate structure according to claim 1, wherein the second main surface of the substrate is further formed with a drain to form a VDMOS device.

6. The device having a trench gate structure according to claim 1, wherein the second main surface of the substrate is formed with a collector region of the second conductivity type, and a surface of the collector region is formed with a collector electrode to form an IGBT device.

7. The device having a trench gate structure according to claim 1, wherein the internal angle of the recess is between 20~70°.

8. A method of making a device having a trench gate structure, comprising steps of:
providing a substrate, the substrate having a first conductivity type, and the substrate having a first main surface and a second main surface opposite to the first main surface;
forming a drift region on the first main surface of the substrate, the drift region having the first conductivity type, and a carrier content of the drift region being lower than that of the substrate;
forming a well region on the drift region, and the well region having a second conductivity type opposite to the first conductivity type;
forming a trench gate passing through the well region and reaching the drift region, a bottom corner of two sides of the trench gate having a recess expanding outwardly, and an internal angle of the recess being less than 90°;
forming a heavily-doped region in the well region and at a side edge of the trench gate, and the heavily-doped region having the first conductivity type; and
positioning an electrode on the heavily-doped region, and the electrode contacting with the heavily-doped region and at least partially extending in the well region.

9. The method of making a device having a trench gate structure according to claim 8, wherein a step of performing anisotropic trench etching along a vertical direction until being close to a desirable depth is performed at first, and then a step of performing isotropic etching at a trench bottom is performed, and the isotropic etching is performed vertically and horizontally at the same time to form the recess.

10. The method of making a device having a trench gate structure according to claim 8, wherein the internal angle of the recess is adjusted through an isotropic etching rate, an etching time and an etching temperature.

* * * * *